(12) United States Patent
Tanaka

(10) Patent No.: US 12,160,164 B2
(45) Date of Patent: Dec. 3, 2024

(54) MEASUREMENT APPARATUS, CONTROL METHOD FOR MEASUREMENT APPARATUS, AND MEASUREMENT SYSTEM

(71) Applicant: CANON KABUSHIKI KAISHA, Tokyo (JP)

(72) Inventor: Yu Tanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 245 days.

(21) Appl. No.: 17/738,907

(22) Filed: May 6, 2022

(65) Prior Publication Data
US 2022/0373618 A1  Nov. 24, 2022

(30) Foreign Application Priority Data

May 24, 2021 (JP) .................. 2021-086883

(51) Int. Cl.
| | |
|---|---|
| G01R 33/00 | (2006.01) |
| G05F 1/46 | (2006.01) |
| H02M 1/00 | (2007.01) |
| H02M 1/36 | (2007.01) |
| H02M 3/156 | (2006.01) |

(52) U.S. Cl.
CPC ...... *H02M 1/0045* (2021.05); *G01R 33/0023* (2013.01); *G05F 1/465* (2013.01); *G05F 1/467* (2013.01); *H02M 1/0067* (2021.05); *H02M 1/0083* (2021.05); *H02M 1/36* (2013.01); *H02M 3/156* (2013.01)

(58) Field of Classification Search
CPC ..... G01R 33/0023; G05F 1/465; G05F 1/467; H02M 1/0045; H02M 1/0067; H02M 1/0083; H02M 1/36
See application file for complete search history.

(56) References Cited

U.S. PATENT DOCUMENTS

| | | | | |
|---|---|---|---|---|
| 2017/0147020 | A1* | 5/2017 | Turkewadikar | H02M 1/0045 |
| 2021/0194527 | A1* | 6/2021 | Nakayama | H04B 1/40 |
| 2023/0155419 | A1* | 5/2023 | Shu | H04B 5/77 |
| | | | | 455/41.1 |

FOREIGN PATENT DOCUMENTS

JP   2009-302710 A   12/2009

* cited by examiner

*Primary Examiner* — Justin Seo
*Assistant Examiner* — Kendrick X Liu
(74) *Attorney, Agent, or Firm* — Canon U.S.A., Inc. I.P. Division (57) ABSTRACT

A measurement apparatus includes a linear regulator, a switching regulator, an acquisition unit configured to acquire measurement data by sensing a signal as a measurement target, and a control unit configured to selectively drive the linear regulator or the switching regulator, wherein the control unit is configured to select and drive the linear regulator in a first period in which the measurement data is acquired by the acquisition unit, and select and drive the switching regulator in a second period that is different from the first period.

13 Claims, 8 Drawing Sheets

MEASUREMENT APPARATUS, CONTROL METHOD FOR MEASUREMENT APPARATUS, AND MEASUREMENT SYSTEM

BACKGROUND

Field

The present disclosure relates to a power supply configuration of a measurement apparatus.

Description of the Related Art

A measurement technique for converting a physical phenomenon that cannot be visually observed into numbers and visualizing the physical phenomenon has advanced in various fields. For example, there are measurement techniques using imaging apparatuses typified by a sonar device using an ultrasonic wave, an x-ray imaging apparatus using an X-ray, and a radar using a radio wave. These measurement techniques use a sensing device to detect an acoustic wave or an electromagnetic wave and performs energy conversion thereon to obtain an electric signal. In current techniques, many of electric signals obtained by the sensing device are converted into digital signals by an analog/digital converter (hereinafter referred to as an A/D converter). The digitalization of electric signals realizes a faster processing speed in, for example, storing, transmission and conversion of data, without the need for concern about degradation of the data.

In the field of such measurement technique, similarly to other technical fields, instances of transmitting digitized data or signals through wireless communication are increasing. There are advantages to changing wired connections to wireless connections. For example, using a wireless connection increases the degree of freedom in arrangement of a measurement apparatus, and it also enables checking of data obtained from a distant location in almost real time by transferring the data to another apparatus with high processing capacity at high speed to perform digital processing. At the same time, making a connection wireless also has an impact on the choice of power supply for the measurement apparatus, and typically a measurement apparatus will require a battery therein to drive internal components.

In a measurement apparatus using wireless communication, a voltage supplied from a battery is generally higher than a voltage for driving a component used in wireless communication, and thus a voltage regulator for stabilizing the voltage is often used. Examples of the voltage regulator include a low dropout regulator (hereinafter referred to as an LDO), which is a linear regulator, and a direct current to direct current (DC/DC) converter (hereinafter referred to as a DCDC), which is a switching regulator.

The LDO is usually characterized by requiring high power consumption (that is, having low voltage conversion efficiency) but at the same time producing small ripple and high-frequency noise. On the other hand, the DCDC is characterized by requiring low power consumption (that is, having a high voltage conversion efficiency) but producing large ripple and high-frequency noise. However, in a case where an output current is small, the above-mentioned relationship of the voltage conversion efficiency between the LDC and the DCDC is reversed.

Japanese Patent Application Laid-Open No. 2009-302710 discusses a means of, based on these characteristics, determining whether a mode of a function to be provided requires a light load or a heavy load to switch a power supply.

It is preferable that the measurement apparatus using wireless communication obtain a measurement result with high accuracy without decreasing power efficiency. As described above, the DCDC is characterized by having high voltage conversion efficiency but also characterized by producing large ripple and high-frequency noise. While the high-frequency noise can be noise for a signal obtained by the sensing device in the measurement apparatus, Japanese Patent Application Laid-Open No. 2009-302710 does not take into consideration the possible high-frequency noise. There is an issue that noise contained in an analog electric signal obtained by the sensing device causes disturbance in a digital signal obtained as a measurement result.

SUMMARY

Various embodiments of the present disclosure are directed to a technique of obtaining a highly accurate measurement result without decreasing power efficiency in a measurement apparatus.

According to one embodiment of the present disclosure, a measurement apparatus includes a linear regulator, a switching regulator, an acquisition unit configured to acquire measurement data by sensing a signal as a measurement target, and a control unit configured to selectively drive the linear regulator or the switching regulator, wherein the control unit is configured to select and drive the linear regulator in a first period in which the measurement data is acquired by the acquisition unit, and select and drive the switching regulator in a second period that is different from the first period.

Further features of the present disclosure will become apparent from the following description of example embodiments with reference to the attached drawings.

DESCRIPTION OF THE EMBODIMENTS

Example embodiments for implementing various embodiments of the present disclosure will be described in detail below with reference to the accompanying drawings. The example embodiments described below are merely examples for implementing the present disclosure, and should be modified or changed as appropriate depending on a configuration of an apparatus to which embodiments of the present disclosure are applied and various conditions, and the present invention is not necessarily limited to the example embodiments described below. Not all combinations of features described in the example embodiments are necessarily essential to a means for solving the issues of the present disclosure. The same components are denoted by the same reference signs and numerals and described.

Figure 1:
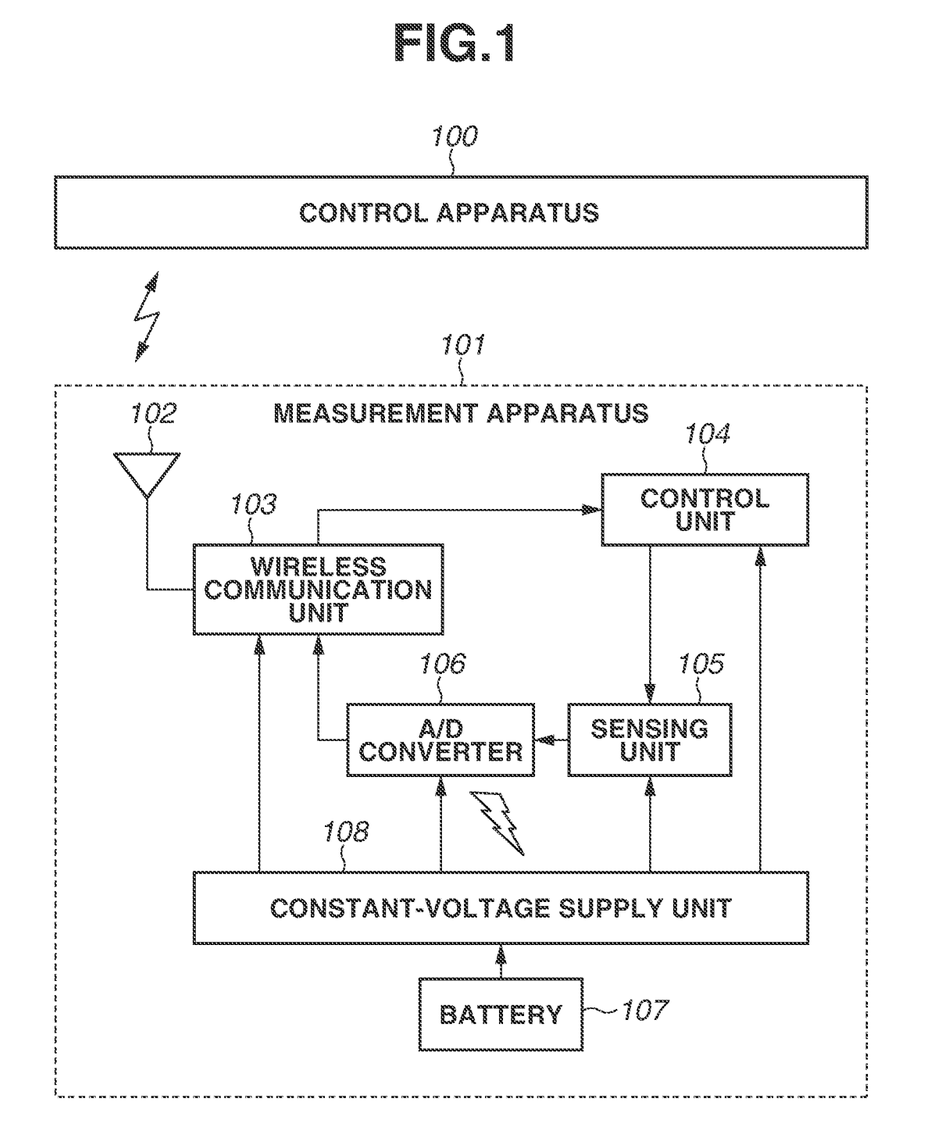
FIG. 1 illustrates a configuration example of a typical measurement system.

FIG. 1 illustrates a configuration example of a typical measurement system. The measurement system includes a control apparatus 100 and a measurement apparatus 101. The control apparatus 100 transmits a control signal for instructing acquisition of measurement data to the measurement apparatus 101. The measurement apparatus 101 acquires the measurement data upon receipt of the control signal from the control apparatus 100, and then transmits the measurement data to the control apparatus 100 as a measurement result. Communication between the control apparatus 100 and the measurement apparatus 101 can be performed wirelessly by using, for example, a wireless local area network (LAN). Assume that the wireless LAN is used in this measurement system.

The measurement apparatus 101 includes an antenna 102, a wireless communication unit 103, a control unit 104, a sensing unit 105, an analog to digital (A/D) converter 106, a battery 107, and a constant-voltage supply unit 108. The wireless communication unit 103 performs communication (signal transmission/reception) using the wireless LAN via the antenna 102. The control unit 104 drives the sensing unit 105 or the A/D converter 106 based on a control signal that is transmitted from the control apparatus 100 and received by the wireless communication unit 103. The sensing unit 105 includes a sensing device. The sensing unit 105 executes sensing, senses a signal (sensing signal) that is a measurement target, such as an acoustic wave and an electromagnetic wave, and converts the signal into an analog electric signal. The A/D converter 106 converts the analog electric signal converted by the sensing unit 105 into a digital signal. The wireless communication unit 103 can transmit the digital signal to the control apparatus 100 as a measurement result. The battery 107 functions as a power source of the measurement apparatus 101. The constant-voltage supply unit 108 supplies a constant voltage from the battery 107 to each component. The constant-voltage supply unit 108 can include a low dropout regulator (hereinafter referred to as an LDO), which is a linear regulator, or a direct current to direct current (DC/DC) converter (hereinafter referred to as a DCDC), which is a switching regulator.

In order to obtain the measurement data as a measurement result without disturbance, noise is to be prevented from containing in the measurement data before the A/D converter 106 converts the analog electric signal obtained by the sensing unit 105 into the digital signal as much as possible. However, in a case where the constant-voltage supply unit 108 uses the DCDC, high-frequency noise that is generated from the DCDC is superimposed on the analog electric signal, whereby a signal-to-noise (S/N) ratio of the measurement data can be degraded. In contrast, in a case where the constant-voltage supply unit 108 uses the LDO, such high-frequency noise is not generated, and thus there is no influence on the measurement data.

In consideration of such characteristics, measurement systems according to some example embodiments will be described below.

Configuration of Measurement System

Figure 2:
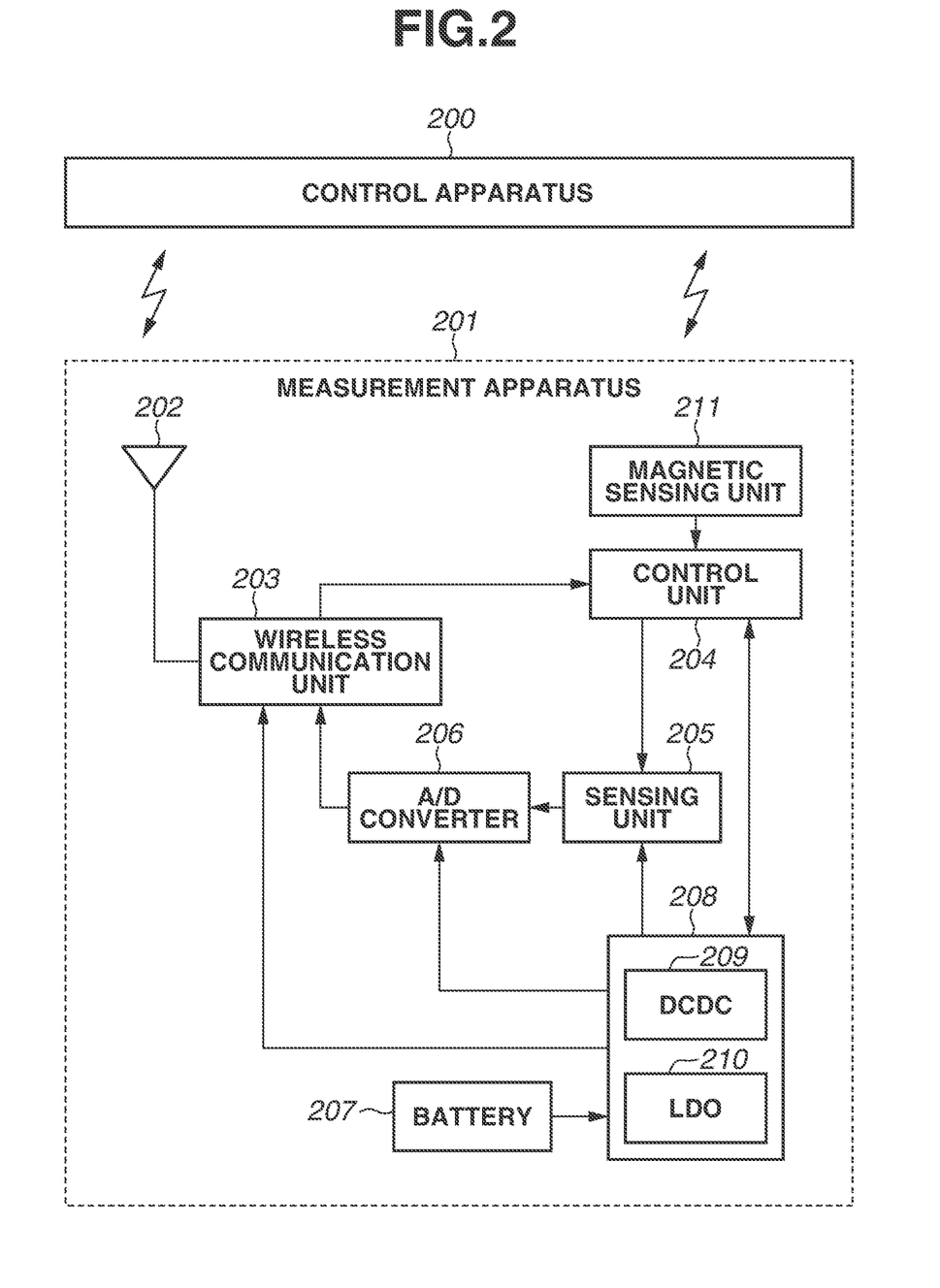
FIG. 2 illustrates a configuration example of a measurement system according to a first example embodiment.

A first example embodiment is now described. FIG. 2 illustrates a configuration example of the measurement system according to the present example embodiment. In the measurement system illustrated in FIG. 2, a control apparatus 200 can generate a magnetic field and transmit a control signal to a measurement apparatus 201 using the magnetic field. The measurement apparatus 201 can transmit measurement data to the control apparatus 200 via the wireless LAN.

The measurement apparatus 201 illustrated in FIG. 2 includes an antenna 202, a wireless communication unit 203, a control unit 204, a sensing unit 205, an A/D converter 206, a battery 207, a constant-voltage supply unit 208, and a magnetic sensing unit 211. The antenna 202, the wireless communication unit 203, the control unit 204, the sensing unit 205, the A/D converter 206, and the battery 207 have respective functions similar to those of the antenna 102, the wireless communication unit 103, the control unit 104, the sensing unit 105, the A/D converter 106, and the battery 107 in the measurement apparatus 101 illustrated in FIG. 1. The magnetic sensing unit 211 includes a magnetic switch and a magnetic sensor that can sense a magnetic field. The magnetic sensing unit 211 can convert a state of the magnetic field into an electric signal (corresponding to a control signal in the present example embodiment).

The constant-voltage supply unit 208 includes a DCDC 209 and an LDO 210. The constant-voltage supply unit 208 functions as a voltage conversion unit that converts voltage from the battery 207 (power source) and supplies the voltage to the measurement apparatus 201, and the DCDC 209 and the LDO 210 are configured to be switched therebetween (for example, be connected in parallel). The control unit 204 can drive the DCDC 209 and the LDO 210 in a selective manner.

As described above, the control apparatus 200 can generate the magnetic field and transmit the control signal to the measurement apparatus 201 using the magnetic field. The control signal includes an acquisition period (acquisition timing) in which the measurement apparatus 201 acquires the measurement data and delay time (waiting time) with respect to the acquisition period. The acquisition period and the delay time are set by the control apparatus 200. Acquisition of the measurement data includes execution of sensing and generation of an analog electric signal that are executed by the sensing unit 205 and conversion from the analog electric signal to a digital signal that is executed by the A/D converter 206. The magnetic sensing unit 211 of the measurement apparatus 201 determines that a control signal is received as a result of sensing of the magnetic field and notifies the control unit 204 of the control signal (outputs the control signal to the control unit 204). The delay time represents time from when the magnetic sensing unit 211 outputs the control signal to the control unit 204, i.e., when control unit 204 detect the control signal, to a start timing of the acquisition period.

Upon sensing the magnetic field with an intensity (level) that is equal to or greater than a predetermined threshold a predetermined number of times, the magnetic sensing unit 211 can determine that the control signal has been received (sensed) from the control apparatus 200. This can prevent erroneous sensing of a magnetic field. For example, in a case where a measurement target of the measurement apparatus 201 is a weak magnetic field, there is a possibility that the magnetic sensing unit 211 erroneously senses the weak magnetic field as the magnetic field from the control apparatus 200 (that is, the control signal). To prevent such erroneous sensing, it is possible to set the predetermined threshold for the magnetic field that can be sensed (detected) by the magnetic sensing unit 211 to be less than the intensity of the magnetic field from the control apparatus 200 and greater than the intensity of the weak magnetic field that is the measurement target.

The control unit 204 switches between the DCDC 209 and the LDO 210 in the constant-voltage supply unit 208 in synchronized timing when the sensing unit 205 and the A/D converter 206 operate, based on the control signal received by the magnetic sensing unit 211 and output from the magnetic sensing unit 211 to the control unit 204. Specifically, the control unit 204 drives the LDO 210 and stops the DCDC 209 in a period (acquisition period) in which the sensing unit 205 and the A/D converter 206 acquire the measurement data. In this manner, in terms of power consumption, the measurement apparatus 201 performs driving with the DCDC 209 as much as possible, i.e., in a period other than the period for acquiring the measurement data, and performs driving with the LDO 210 at the time of acquisition of the measurement data, i.e., at the time when the sensing unit 205 and the A/D converter 206 operate, in order to obtain high-quality measurement data. This enables execution of power driving in consideration of a limited power supply capacity of the battery 207.

Timing for Switching Between DCDC and LDO

Figure 3:
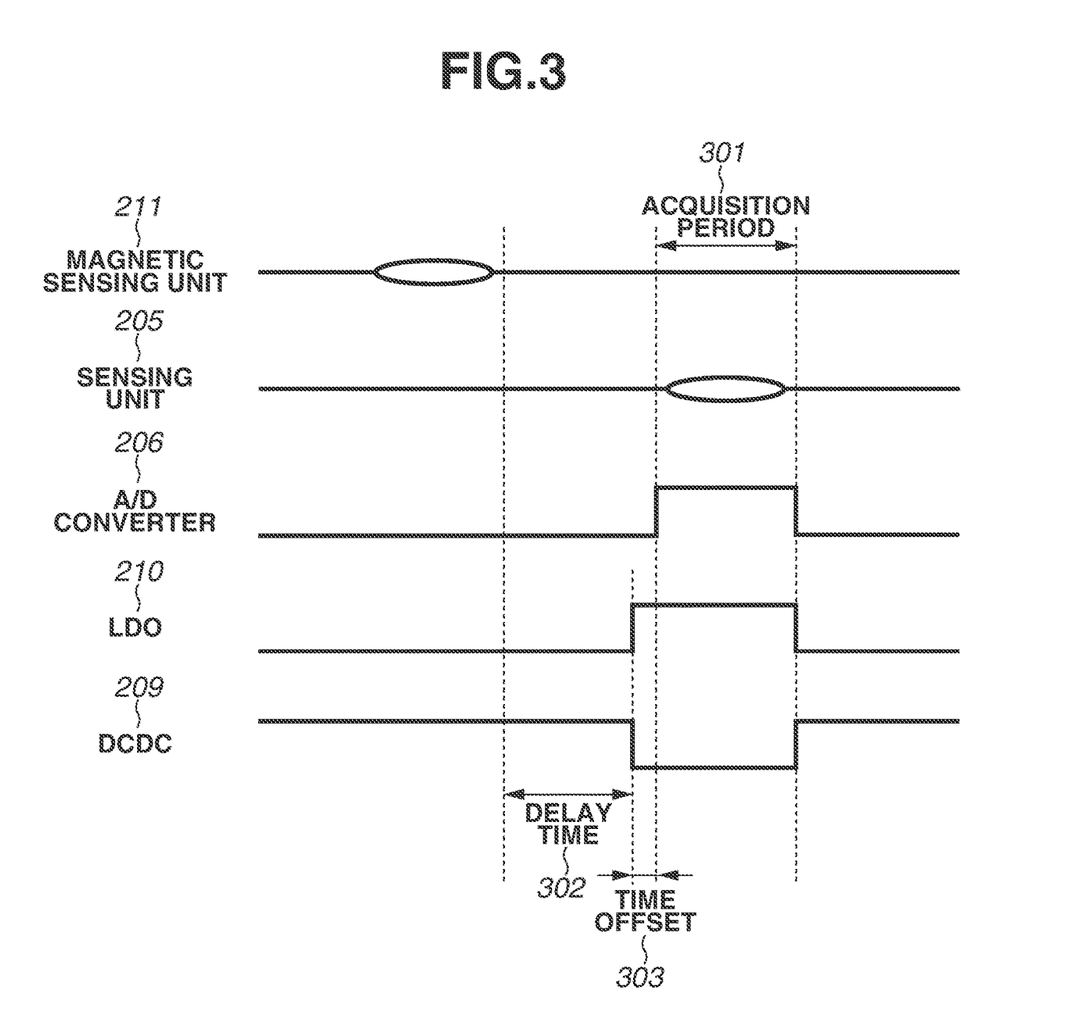
FIG. 3 illustrates a timing chart for the measurement system according to the first example embodiment.

A timing for switching between the DCDC 209 and the LDO 210 performed by the control unit 204 is now described with reference to FIG. 3. FIG. 3 is a timing chart illustrating operations of the magnetic sensing unit 211, the sensing unit 205, the A/D converter 206, and the LDO 210 and DCDC 209 of the constant-voltage supply unit 208. In the present example embodiment, assume that the acquisition period in which the measurement apparatus 201 acquires the measurement data (corresponding to an acquisition period 301 in FIG. 3) and the delay time (corresponding to delay time 302) with respect to the acquisition period are set and managed by the control apparatus 200.

The control apparatus 200 notifies the measurement apparatus 201 of the control signal including information regarding the acquisition period 301 and the delay time 302 using the magnetic field. Upon determining that the control signal has been received, the magnetic sensing unit 211 outputs the control signal to the control unit 204. The control unit 204 waits for the delay time 302 after detection of the control signal from the magnetic sensing unit 211 and thereafter performs control for switching between the DCDC 209 and the LDO 210. To avoid noise generated due to voltage fluctuation at the time of switching from the DCDC 209 to the LDO 210, a time offset 303 can be provided a predetermined time earlier than the timing of start of the acquisition period 301 as in the example illustrated in FIG. 3. The time offset 303 may be included in the control signal transmitted from the control apparatus 200 or may be set by the control unit 204.

In the acquisition period 301, the control unit 204 controls the sensing unit 205 and the A/D converter 206 to operate to acquire the measurement data. Since a digital signal is not generated and an analog electric signal is dropped in a period in which the A/D converter does not operate, a period in which the DCDC 209 is stopped is only limited to the acquisition period 301. Hence, the control unit 204 drives the DCDC 209 that has a high voltage conversion efficiency in a period other than the acquisition period 301, and drives the LDO 210 that generates small high-frequency noise in the acquisition period 301. In the example using the time offset 303 in FIG. 3, the control unit 204 stops the DCDC 209 when the delay time 302 ends, and drives the LDO 210 throughout a period from the start of the time offset 303 until the end of the acquisition period 301. In this manner, the control unit 204 promptly switches from the LDO 210 to DCDC 209 as soon as the acquisition period 301 ends, thereby enabling control to be performed with consideration for power efficiency.

Flow of Processing Executed by Measurement Apparatus

Figure 4:
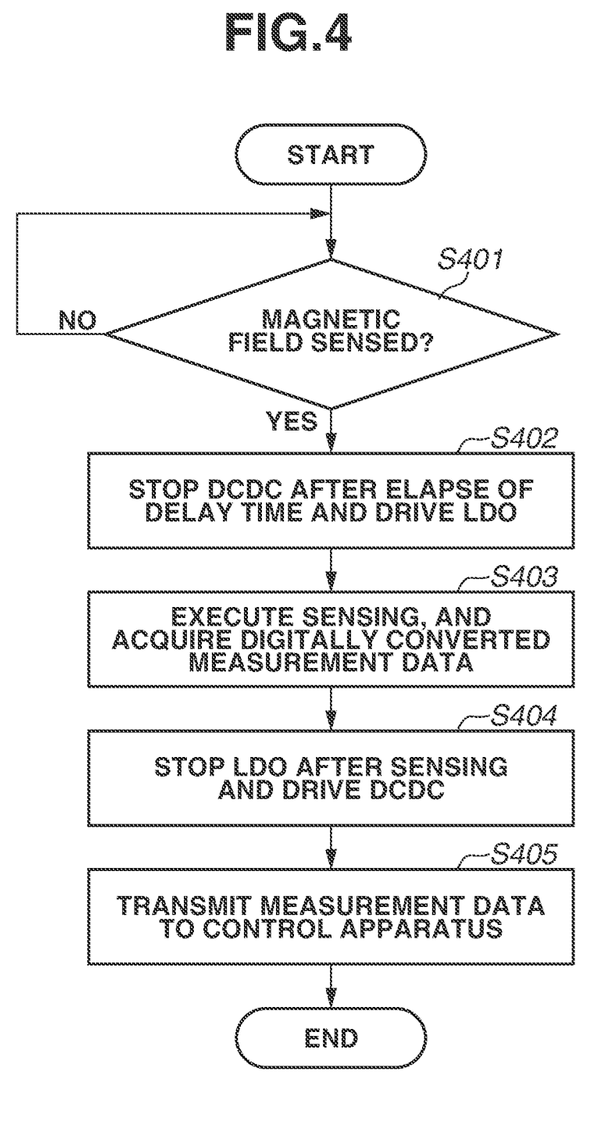
FIG. 4 is a flowchart illustrating processing executed by the measurement apparatus according to the first example embodiment.

FIG. 4 is a flowchart illustrating processing executed by the measurement apparatus 201 according to the present example embodiment. Assume that the control apparatus 200 and the measurement apparatus 201 are in a state of being connected to each other via the wireless LAN. Processing described in FIG. 4 is started when the control apparatus 200 sets the acquisition period for the measurement apparatus 201 to acquire the measurement data and notifies the measurement apparatus 201 of the control signal including the acquisition period and the delay time with respect to the acquisition period (and the time offset as an option) using the magnetic field. The description is given of the flowchart illustrated in FIG. 4 with reference to the timing chart illustrated in FIG. 3.

In step S401, it is determined whether the magnetic sensing unit 211 has sensed (detected) the magnetic field and detected (received) the control signal from the control apparatus 200. In a case where it is determined that the magnetic sensing unit 211 has sensed (detected) the magnetic field and detected (received) the control signal from the control apparatus 200 (YES in step S401), the magnetic sensing unit 211 outputs the control signal to the control unit 204, and the processing proceeds to step S402. In step S402, upon receiving the control signal from the magnetic sensing unit 211, the control unit 204 stops the DCDC 209 and drives the LDO 210 based on the timing chart illustrated in FIG. 3. In other words, the control unit 204 stops the DCDC and drives the LDO 210 after the elapse of the delay time 302 from detection of the control signal output from the magnetic sensing unit 211.

Subsequently, in step S403, the control unit 204 controls the sensing unit 205 and the A/D converter 206 in the acquisition period 301 to execute sensing and acquire digitally converted measurement data. Since the LDO 210 operates at this time, high-frequency noise is not generated, and noise generated by the constant-voltage supply unit 208 is not contained in the measurement data. In step S404, the control unit 204 switches from driving of the LDO 210 to driving of the DCDC 209 in synchronized timing with the end of the acquisition period 301. In other words, the control unit 204 stops the LDO 210 and drives the DCDC 209. In step S405, the wireless communication unit 203 transmits the measurement data output from the A/D converter 206 to the control apparatus 200 using the wireless LAN via the antenna 202.

In this manner, the measurement apparatus according to the present example embodiment includes the magnetic sensing unit 211 for sensing the magnetic field, and, based on the control signal received via the magnetic sensing unit 211, drives the LDO 210 and stops the DCDC 209 in the period when the measurement data is acquired. This can prevent a decrease in power efficiency and at the same time can prevent noise that is generated by the DCDC 209 from being contained in the analog signal obtained by the sensing unit 205 in the period in which the signal obtained by the sensing unit 205 is acquired by the A/D converter 206, thereby enabling acquisition of a highly accurate measurement result.

A second example embodiment is now described. As the present example embodiment, a configuration without using the magnetic sensing unit 211 that functions to detect a magnetic field is described. The following description is given mainly of components different from those in the first example embodiment, and a description of similar components is not repeated.

Configuration of Measurement System

Figure 5:
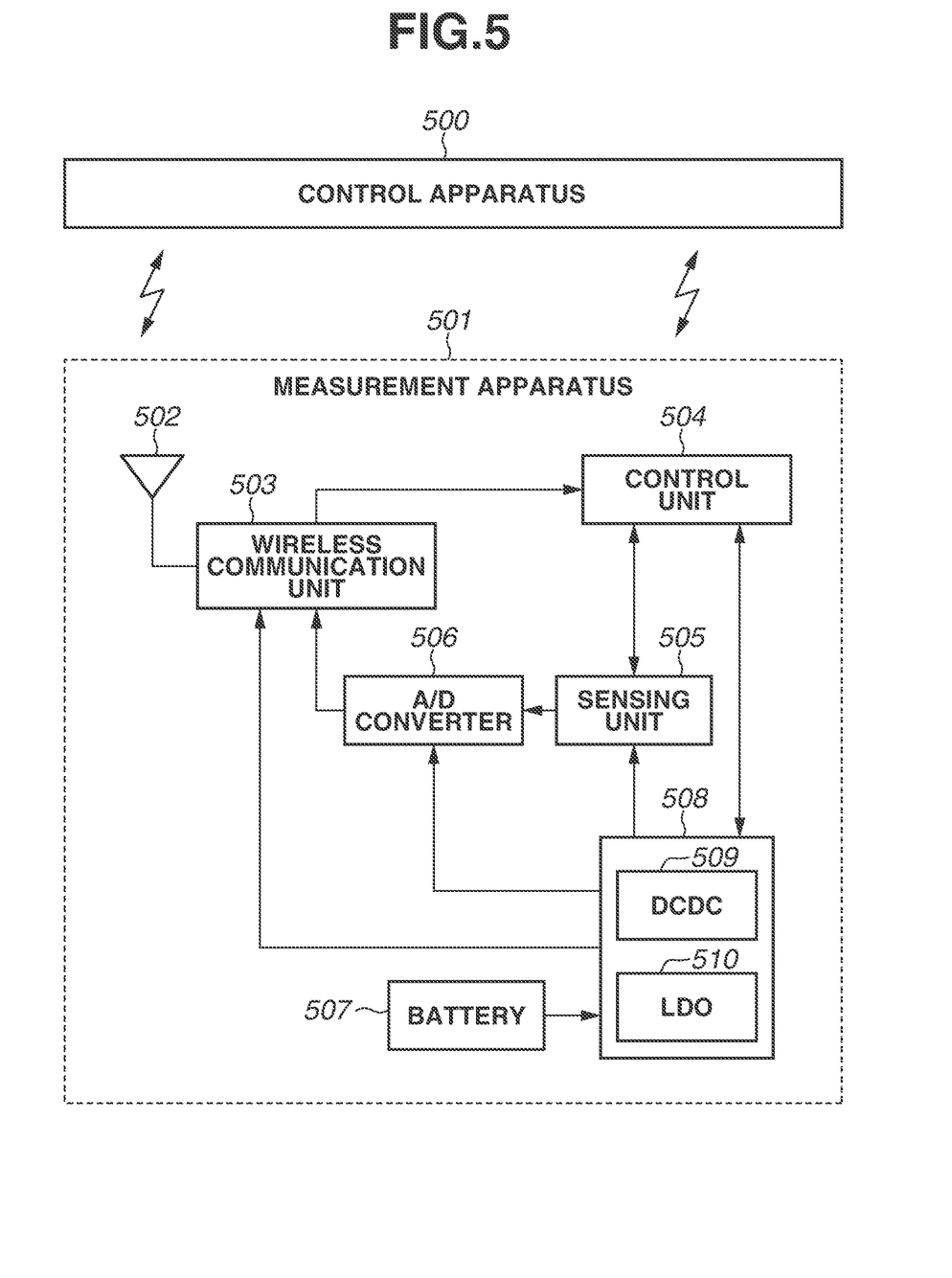
FIG. 5 illustrates a configuration example of a measurement system according to a second example embodiment.

FIG. 5 illustrates a configuration example of a measurement system according to the present example embodiment. In the measurement system illustrated in FIG. 5, a control apparatus 500 can generate a magnetic field and transmit a control signal to a measurement apparatus 501 using the magnetic field. The measurement apparatus 501 can transmit measurement data to the control apparatus 500 via the wireless LAN.

The measurement apparatus 501 illustrated in FIG. 5 includes an antenna 502, a wireless communication unit 503, a control unit 504, a sensing unit 505, an A/D converter 506, a battery 507, and a constant-voltage supply unit 508. The antenna 502, the wireless communication unit 503, the control unit 504, the A/D converter 506, and the battery 507 have respective functions similar to those of the antenna 102, the wireless communication unit 103, the control unit 104, the A/D converter 106, and the battery 107 in the measurement apparatus 101 illustrated in FIG. 1. The constant-voltage supply unit 508 includes a DCDC 509 and an LDO 510. In the constant-voltage supply unit 508, the DCDC and the LDO 510 are, for example, connected in parallel. The DCDC 509 and/or the sensing unit 505 in the measurement apparatus 501 according to the present example embodiment are/is configured to detect a magnetic field. The control unit 504 determines whether a control signal has been received from the control apparatus 500 based on an output from the DCDC 509 and/or the sensing unit 505, and can detect the control signal when the control unit 504 determines that the control signal has been received from the control apparatus 500. For example, upon sensing a magnetic field with an intensity (level) that is equal to or greater than a predetermined threshold a predetermined number of times based on the output from the DCDC 509 and/or the sensing unit 505, the control unit 504 can determine that the control signal has received (sensed) from the control apparatus 500. Circuit configuration examples of the DCDC 509 and the sensing unit 505 according to the present example embodiment are described with reference to FIGS. 6 and 7.

As described above, the control apparatus 500 can generate the magnetic field and transmit the control signal to the measurement apparatus 501 using the magnetic field. The control signal according to the present example embodiment includes an acquisition period in which the measurement apparatus 501 acquires the measurement data, and the acquisition period is set by the control apparatus 500. In the present example embodiment, delay time with respect to the acquisition period is set and managed by the control unit 504 of the measurement apparatus 501. For example, the control unit 504 sets the delay time corresponding to a pattern of a magnetic field (magnetic field pattern/measurement sequence) having an intensity (level) equal to or greater than the predetermined threshold that is sensed by the DCDC 509 and/or the sensing unit 505, and manages the delay time in a table. The magnetic field pattern is formed by a plurality of sensed magnetic fields.

Upon detecting the control signal from the control apparatus 500 based on the output from the DCDC 509 and/or the sensing unit 505, the control unit 504 switches between the DCDC 509 and the LDO 510 in the constant-voltage supply unit 508 based on the control signal. Specifically, the control unit 504 drives the LDO 510 and stops the DCDC 509 in a period in which the sensing unit 505 and the A/D converter 506 acquire the measurement data. In this manner, in terms of power consumption, the measurement apparatus 501 performs driving with the DCDC 509 as much as possible and performs driving with the LDO 510 at the time of acquisition of the measurement data, i.e., at the time when the sensing unit 505 and the A/D converter 506 operate, in order to obtain high-quality measurement data. This enables execution of power driving in consideration of a limited power supply capacity of the battery 507.

Figure 6:
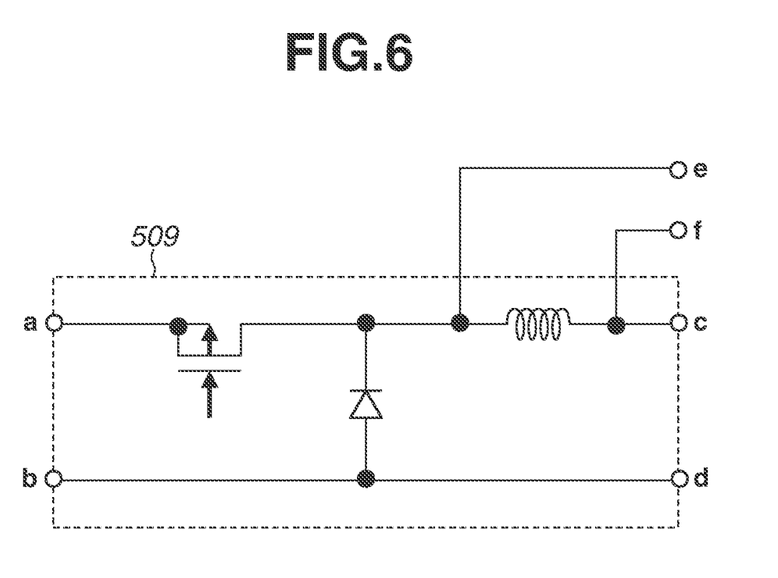
FIG. 6 illustrates a circuit configuration example of a direct current to direct current (DC/DC) converter (DCDC) according to the second example embodiment.

FIG. 6 illustrates a circuit configuration example of the DCDC 509 according to the present example embodiment. The DCDC 509 receives a voltage from the battery 507 at a contact point a. The voltage that has passed through a field-effect transistor (FET) and a diode is smoothed by an inductor in an output stage and then a desired voltage is output from a contact point c. Contact points b and d are grounded. Contact points e and f are drawn respective ends of the inductor. The DCDC 509 amplifies a voltage difference (potential difference) between the contact point e and the contact point f by using an amplifier (not illustrated), and outputs the voltage as the magnetic field pattern described above to the control unit 504. In this manner, the control unit 504 can sense the magnetic field using voltage fluctuation and detect the control signal, based on the output from the DCDC 509.

Figure 7:
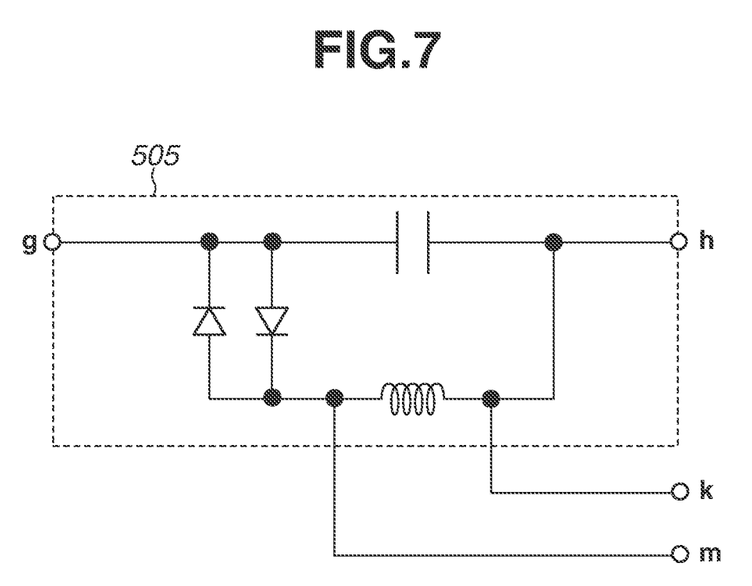
FIG. 7 illustrates a circuit configuration example of a sensing unit according to the second example embodiment.

FIG. 7 is a diagram illustrating a circuit configuration example of the sensing unit 505 according to the present example embodiment. The sensing unit 505 includes a closed loop formed by contact points g and h, and can sense a magnetic field that penetrates the closed loop. Two diodes are connected in respectively different directions in the sensing unit 505. In a case of a strong magnetic field, a capacitor and an inductor resonate in parallel, and the impedance becomes high. In a case of a weak magnetic field, on the other hand, a current is caused to flow. Contact points k and m are drawn from respective ends of the inductor. The sensing unit 505 amplifies a voltage difference (potential difference) between the contact point k and the contact point m by using an amplifier (not illustrated), and outputs the voltage as the magnetic field pattern described above to the control unit 504. In this manner, the control unit 504 can sense the magnetic field using voltage fluctuation and detect the control signal, based on the output from the sensing unit 505.

Flow of Processing Executed by Measurement Apparatus

Figure 8:
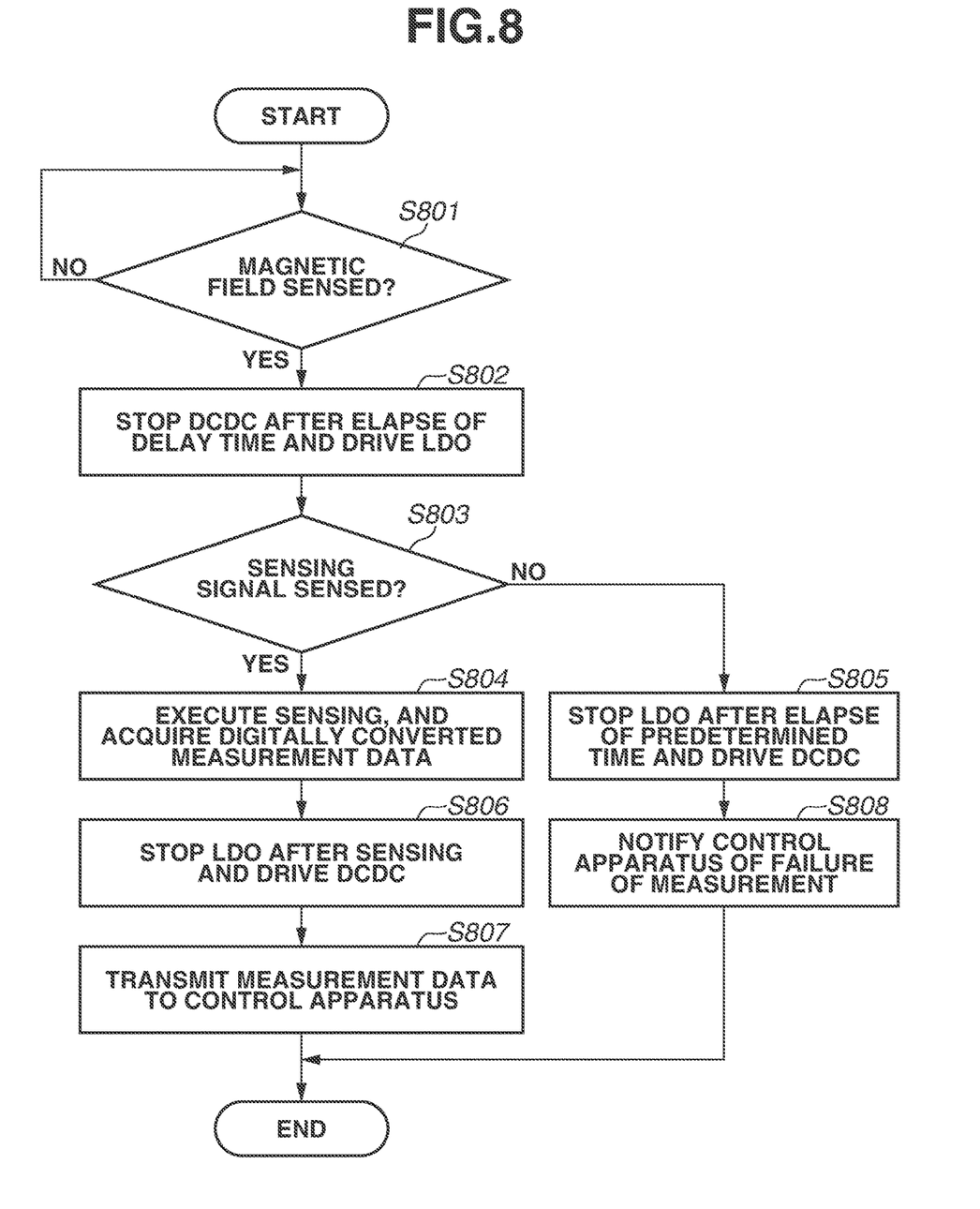
FIG. 8 is a flowchart illustrating processing executed by the measurement apparatus according to the second example embodiment.

FIG. 8 is a flowchart illustrating processing executed by the measurement apparatus 501 according to the present example embodiment. Assume that the control apparatus 500 and the measurement apparatus 501 are in a state of being connected to each other via the wireless LAN. Processing described in FIG. 8 is started when the control apparatus 500 sets the acquisition period in which the measurement apparatus 501 acquires the measurement data and notifies the measurement apparatus 501 of the control signal including the acquisition period (and the time offset as an option) using the magnetic field.

In step S801, the control unit 504 determines whether the DCDC 509 and/or the sensing unit 505 have/has sensed the magnetic field and the control unit 504 has detected (received) the control signal from the control apparatus 200. When the control unit 504 determines that the DCDC 509 and/or the sensing unit 505 have/has sensed the magnetic field and the control unit 504 has detected (received) the control signal from the control apparatus 200 (YES in step S801), the processing proceeds to step S802. In step S802, the control unit 504 stops the DCDC 509 and drives the LDO 510. In the present example embodiment, in step S802, the control unit 504 refers to delay time corresponding to the detected magnetic field pattern from the stored table, stops the DCDC 509 and drives the LDO 510 after the elapse of the delay time from the detection of the control signal.

Subsequently, in step S803, the control unit 504 controls the sensing unit 505 at a start timing of the acquisition period included in the control signal, and attempts to sense a desired sensing signal. In a case where the sensing signal is detected (YES in step S803), the processing proceeds to step S804. In step S804, the control unit 204 controls the A/D converter 506 to execute sensing, and acquires digitally converted measurement data. In a case where the measurement data can be acquired, then in step S806, the control unit 504 switches from the LDO 510 to the DCDC 509 in synchronized timing with the end timing of the acquisition period. In step S807, the wireless communication unit 503 transmits the measurement data output from the A/D converter 506 to the control apparatus 500 using the wireless LAN via the antenna 502.

On the other hand, in a case where the sensing signal is not sensed even after the elapse of predetermined time (NO in step S803), the processing proceeds to step S805. In step S805, the control unit 504 switches from driving of the LDO 510 to driving of the DCDC 509. In a case where the measurement data cannot be acquired, then in step S808, the wireless communication unit 503 notifies the control apparatus 500 of failure of measurement via the wireless LAN. The notification can be given using a light emitting diode (LED), warning sound, and a graphical user interface (GUI).

In this manner, the measurement apparatus according to the present example embodiment drives the LDO 510 and stops the DCDC 509 in the period of acquiring the measurement data, based on the control signal received by using the magnetic field sensed by the DCDC 509 or the sensing unit 505. This can prevent a decrease in power efficiency and at the same time can prevent noise that is generated by the DCDC 509 from being contained in the analog signal obtained by the sensing unit 505 in the period in which the signal obtained by the sensing unit 505 is acquired by the A/D converter 506, thereby enabling acquisition of a highly accurate measurement result.

The description has been given of the example in which the control signal is transmitted from the control apparatus using the magnetic field in the above-described example embodiments, but the control signal may be configured to be transmitted by using another means. For example, in FIG. 2, the control signal may be transmitted/received using communication that uses frequency-division duplexing, or time-division duplexing, space separation via the antenna 202, which differs from the communication used for transmission of the measurement data.

According to various embodiments of the present disclosure, the measurement apparatus can obtain a highly accurate measurement result without decreasing power efficiency.

While example embodiments have been described, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2021-086883, filed May 24, 2021, which is hereby incorporated by reference herein in its entirety.

What is claimed is:

1. A measurement apparatus comprising:
   a linear regulator;
   a switching regulator;
   an acquisition unit configured to acquire measurement data by sensing a signal as a measurement target; and
   a control unit configured to selectively drive the linear regulator or the switching regulator,
   wherein the control unit is configured to select and drive the linear regulator in a first period in which the measurement data is acquired by the acquisition unit, and select and drive the switching regulator in a second period that is different from the first period,
   wherein the control unit is configured to set the first period based on a control signal for instructing acquisition of the measurement data, the control signal being transmitted from a control apparatus using a magnetic field, and
   wherein the control unit is configured to sense the magnetic field and detect the control signal using voltage fluctuation detected by at least one of the switching regulator or the acquisition unit.

2. The measurement apparatus according to claim 1, further comprising a magnetic sensing unit configured to sense the magnetic field and receive the control signal,
   wherein the magnetic sensing unit is configured to, upon sensing the magnetic field with an intensity that is equal to or greater than a predetermined threshold a predetermined number of times, determine that the magnetic sensing unit has received the control signal and output the control signal to the control unit.

3. The measurement apparatus according to claim 2, wherein, in a case where the measurement target is the magnetic field, the predetermined threshold is set to be greater than an intensity of the magnetic field as the measurement target and less than the intensity of the magnetic field from the control apparatus.

4. The measurement apparatus according to claim 2,
   wherein the control signal includes information regarding an acquisition period in which the acquisition unit acquires the measurement data and waiting time with respect to the acquisition period, and
   wherein the control unit is configured to set the first period including the acquisition period after elapse of the waiting time from detection of the control signal output from the magnetic sensing unit.

5. The measurement apparatus according to claim 1, wherein the control unit is configured to, upon sensing the magnetic field with an intensity that is equal to or greater than a predetermined threshold a predetermined number of times, determine that the control unit has detected the control signal.

6. The measurement apparatus according to claim 5,
   wherein the control signal includes information regarding an acquisition period for the acquisition unit to acquire the measurement data, and
   wherein the control unit is configured to acquire waiting time corresponding to a pattern of the sensed magnetic field, and set the first period after elapse of the waiting time from detection of the control signal.

7. The measurement apparatus according to claim 1, further comprising a transmission unit configured to wirelessly transmit the measurement data to a control apparatus.

8. The measurement apparatus according to claim 1, wherein the control unit is configured to switch from the switching regulator to the linear regulator before start of the first period.

9. The measurement apparatus according to claim 1, wherein, in a case where the acquisition unit fails to acquire the measurement data in the first period, the control unit is configured to switch from the linear regulator to the switching regulator.

10. The measurement apparatus according to claim 9, wherein, in a case where a predetermined time period in which the measurement data is not acquired has passed in the first period, the control unit is configured to determine that the acquisition unit fails to acquire the measurement data.

11. The measurement apparatus according to claim 7, wherein, in a case where the acquisition unit fails to acquire the measurement data, the transmission unit performs a notification of failure of measurement.

12. A control method for a measurement apparatus including a linear regulator and a switching regulator, the method comprising:
  acquiring measurement data by sensing a signal as a measurement target; and
  performing control to selectively drive the linear regulator or the switching regulator;
  wherein the control is performed such that the linear regulator is selected and driven in a first period in which the measurement data is acquired, and the switching regulator is selected and driven in a second period that is different from the first period,
  wherein the control is performed to set the first period based on a control signal for instructing acquisition of the measurement data, the control signal being transmitted from a control apparatus using a magnetic field, and
  wherein the control is performed to sense the magnetic field and detect the control signal using voltage fluctuation detected by at least one of the switching regulator or the acquiring.

13. A measurement system including a control apparatus and a measurement apparatus, the measurement system comprising:
  wherein the control apparatus includes a transmission unit configured to transmit a control signal for instructing acquisition of measurement data to the measurement apparatus using a magnetic field;
  wherein the measurement apparatus includes:
    a linear regulator;
    a switching regulator;
    an acquisition unit configured to acquire the measurement data by sensing a signal as a measurement target; and
    a control unit configured to selectively drive the linear regulator or the switching regulator,
  wherein the control unit is configured to select and drive the linear regulator in a first period in which the measurement data is acquired by the acquisition unit, and select and drive the switching regulator in a second period that is different from the first period, and
  wherein the first period is set based on the control signal,
  wherein the control unit is configured to set the first period based on a control signal for instructing acquisition of the measurement data, the control signal being transmitted from a control apparatus using a magnetic field, and
  wherein the control unit is configured to sense the magnetic field and detect the control signal using voltage fluctuation detected by at least one of the switching regulator or the acquisition unit.

* * * * *